(12) United States Patent
Yanagihara et al.

(10) Patent No.: US 7,368,793 B2
(45) Date of Patent: May 6, 2008

(54) HEMT TRANSISTOR SEMICONDUCTOR DEVICE

(75) Inventors: Manabu Yanagihara, Osaka (JP);
Daisuke Ueda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 141 days.

(21) Appl. No.: 11/081,622

(22) Filed: Mar. 17, 2005

(65) Prior Publication Data

US 2005/0205892 A1    Sep. 22, 2005

(30) Foreign Application Priority Data

Mar. 22, 2004    (JP) ............................. 2004-082277

(51) Int. Cl.
*H01L 29/778* (2006.01)
(52) U.S. Cl. ............... 257/409; 257/646; 257/192; 257/E29.255; 438/780
(58) Field of Classification Search ................ 257/103, 257/646, 192
See application file for complete search history.

(56) References Cited

U.S. PATENT DOCUMENTS

2004/0084775 A1* 5/2004 Sugino et al. ............. 257/758
2005/0064724 A1* 3/2005 Sugino et al. ............. 438/778
2005/0124176 A1* 6/2005 Sugino et al. ............. 438/795
2005/0189620 A1* 9/2005 Sugino et al. ............. 257/613
2006/0157729 A1* 7/2006 Ueno et al. ................ 257/103

FOREIGN PATENT DOCUMENTS

JP      2003-115487      4/2003

* cited by examiner

*Primary Examiner*—Jerome Jackson
*Assistant Examiner*—Paul A Budd
(74) *Attorney, Agent, or Firm*—McDermott Will & Emery LLP

(57) ABSTRACT

The semiconductor device of the present invention includes a device formation region formed on a substrate and including at least one semiconductor region, and a first electrode and a second electrode formed spaced apart from each other on the device formation region. A semi-insulating film is formed to cover the surface of a portion of the semiconductor region, which portion is located between the first and second electrodes and in which portion a depletion layer extends when a reverse bias is applied between the first and second electrodes.

16 Claims, 6 Drawing Sheets

HEMT TRANSISTOR SEMICONDUCTOR DEVICE

CROSS-REFERENCE TO RELATED APPLICATION

This application claims priority under 35 U.S.C. §119 on Patent Application No. 2004-082277 filed in Japan on Mar. 22, 2004, the entire contents of which are hereby incorporated by reference.

BACKGROUND OF THE INVENTION

The present invention relates to semiconductor devices, and more particularly, field effect transistors, bipolar transistors, diodes and the like that are required to have a high breakdown voltage.

A MESFET (metal-semiconductor field effect transistor) is one of semiconductor devices in which compound semiconductors such as gallium arsenide (GaAs), indium phosphide (InP), and gallium nitride (GaN) are used. A MESFET has a Schottky junction in which a metal gate electrode is formed directly on a semiconductor layer, and the size of a depletion layer formed in the semiconductor layer due to the Schottky junction is made to change according to a voltage applied to the gate electrode, thereby controlling a current flowing through the channel layer.

One type of MESFET is a HEMT (high electron mobility transistor) in which a heterojunction structure is used. HEMTs, which are capable of operating at high speed, are widely applied, e.g., to low-noise amplifiers for receiving satellite broadcasting, switching devices and power devices for cellular telephones, and the like.

In order to use MESFETs, including HEMTs, as switching devices, power devices or the like, it is necessary to increase the gate-drain breakdown voltage thereof, and therefore it is preferable that in the MESFETs the semiconductor layer on which the gate electrode is formed be made of an undoped semiconductor that has a wider bandgap than the channel layer.

FIG. 9 illustrates a cross-sectional structure of a conventional GaAs-MESFET. As shown in FIG. 9, a channel layer 102 made of an n-type semiconductor is formed on a semi-insulating GaAs substrate 101, and an undoped aluminum gallium arsenide (AlGaAs) layer 103 is formed on the channel layer 102. A gate electrode 108 is formed on the AlGaAs layer 103, and a source electrode 106 and a drain electrode 107 are formed with the gate electrode 108 interposed therebetween. The source electrode 106 and the drain electrode 107 are respectively formed on a source region 104 and a drain region 105, which are high carrier concentration regions formed on the GaAs substrate 101. On the surface of the MESFET thus formed, a protective film 109, which is made of an insulating film such as a silicon oxide film ($SiO_2$), is provided.

The protective film 109 is provided to prevent the creation of dangling bonds and oxidation-induced surface states on the semiconductor layer surface. In recent years, a BCN film made of boron, carbon, and nitrogen has also been used as a protective film to reduce the dielectric constant of the protective film (see Japanese Laid-Open Publication No. 2003-115487, for example.)

However, crystal defects or the like, occurring during a crystal growth step or other fabrication process steps, are present on the surface of the undoped AlGaAs layer 103, causing the resistivity of the surface to be nonuniform. In a case where the surface of the undoped AlGaAs layer 103 has a nonuniform resistivity, if a high-voltage reverse bias is applied between the gate electrode 108 and the drain electrode 107, the electric field is locally concentrated in a region due to the nonuniform resistivity. This results in a problem in that the breakdown voltage of the semiconductor device drops significantly below a design value.

Similar problems arise not only in field effect transistors but also hetero-bipolar transistors (HBTs), Schottky diodes and the like.

Such significant decrease in breakdown voltage is likely to occur in semiconductor devices in which compound semiconductors, such as GaAs, InP, and GaN, are used. Since the semiconductor material of a compound semiconductor contains two or more elements, a deviation from the stoichiometric composition is likely to occur on a semiconductor layer surface, such that the resistivity on that semiconductor layer surface easily becomes nonuniform.

SUMMARY OF THE INVENTION

It is therefore an object of the present invention to overcome the above problem and realize a semiconductor device in which a semiconductor layer surface has a highly uniform resistivity and decrease in breakdown voltage caused by a concentration of electric field does not occur.

In order to achieve the above object, the inventive semiconductor device has a structure in which the surface thereof is covered with a semi-insulating film.

Specifically, an inventive semiconductor device includes: a device formation region formed on a substrate and including at least one semiconductor region; a first electrode and a second electrode formed spaced apart from each other on the device formation region; and a semi-insulating film covering the surface of a portion of the device formation region, which portion is located between the first and second electrodes and in which portion a depletion layer extends when a reverse bias is applied between the first and second electrodes.

In the inventive semiconductor device, the value of resistance on the surface of the portion of the semiconductor region between the electrodes is substantially constant. Therefore, when a reverse bias is applied between the electrodes, concentration of electric field into a single point does not occur on the surface of the semiconductor region in which a depletion layer extends, even if crystal defects or the like are present on that surface. This prevents local application of a high voltage that would be otherwise caused by an electric field concentration, thereby suppressing a breakdown that would otherwise occur due to local application of a high voltage. As a result, it is possible to realize a high voltage semiconductor device.

The inventive device preferably further includes an insulating film provided between the semi-insulating film and the surface of the device formation region. This structure reliably provides a reduction in leakage current.

In the inventive device, the semi-insulating film is preferably made of a compound containing nitrogen, carbon, and at least one element selected from the group consisting of boron, aluminum and gallium. This structure allows the electric field applied to the surface of the device formation region to be uniformized reliably.

In the inventive device, the device formation region preferably includes an epitaxial layer formed on the substrate. Also, the device formation region may include a doped layer formed by implanting impurities into the substrate.

In the inventive device, the device formation region preferably includes a channel layer in which electrons move; the first electrode is preferably a gate electrode; the second electrode is preferably a drain electrode; the semiconductor device preferably further includes a source electrode formed in a position that opposes the drain electrode with the gate electrode interposed; and the semiconductor device preferably operates as a field effect transistor, and the semi-insulating film preferably covers a portion of the surface of the device formation region, which is located between the gate and drain electrodes. By forming the semiconductor device having this structure, a high-voltage field effect transistor is obtained.

In this case, the semi-insulating film preferably has a resistivity that is lower than that of silicon nitride and that makes a time constant, which is the product of a value of capacitance between the drain and source electrodes and a value of resistance occurring between the drain and source electrodes due to the semi-insulating film, be longer than a time, which is the reciprocal of a maximum oscillation frequency of the field effect transistor, the resistance value being part of a total value of resistances existing between the drain and source electrodes. Alternatively, the semi-insulating film may have a resistivity that is lower than that of silicon nitride and that makes a time constant, which is the product of a value of capacitance between the drain and gate electrodes and a value of resistance occurring between the drain and gate electrodes due to the semi-insulating film, be longer than a time, which is the reciprocal of a maximum oscillation frequency of the field effect transistor, the resistance value being part of a total value of resistances existing between the drain and gate electrodes. By this structure, it is possible to make an electric field to be applied uniformly without affecting the high frequency characteristics and dc characteristics of the device.

In this case, the resistivity of the semi-insulating film is preferably equal to or higher than $1\times10^6$ Ωcm but not more than $1\times10^{10}$ Ωcm.

In the inventive device, the device formation region preferably includes a collector region, a base region, and an emitter region, which are formed in this order from the lowermost film; the first electrode is preferably a collector electrode formed in a predetermined portion on the corrector region; the second electrode is preferably a base electrode formed in a predetermined portion on the base region; the semiconductor device preferably further includes an emitter electrode formed in a predetermined portion on the emitter region; and the semiconductor device preferably operates as a hetero-bipolar transistor, and the semi-insulating film preferably covers a portion of the surface of the device formation region, which is located between the collector electrode and the base electrode. By forming the semiconductor device having this structure, a high voltage hetero-bipolar transistor is obtained reliably.

In this case, the semi-insulating film preferably has a resistivity that is lower than that of silicon nitride and that makes a time constant, which is the product of a value of capacitance between the collector and emitter electrodes and a value of resistance occurring between the collector and emitter electrodes due to the semi-insulating film, be longer than a time, which is the reciprocal of a maximum oscillation frequency of the hetero-bipolar transistor, the resistance value being part of a total value of resistances existing between the collector and emitter electrodes. Alternatively, the semi-insulating film may have a resistivity that is lower than that of silicon nitride and that makes a time constant, which is the product of a value of capacitance between the collector and base electrodes and a value of resistance occurring between the collector and base electrodes due to the semi-insulating film, be longer than a time, which is the reciprocal of a maximum oscillation frequency of the hetero-bipolar transistor, the resistance value being part of a total value of resistances existing between the collector and base electrodes. By this structure, it is possible to make an electric field to be uniformly applied to the surface of the semiconductor region without affecting the high frequency characteristics and dc characteristics of the hetero-bipolar transistor.

In this case, the resistivity of the semi-insulating film is preferably equal to or higher than $1\times10^6$ Ωcm but not more than $1\times10^{10}$ Ωcm.

In the inventive device, the device formation region preferably includes a low carrier concentration region and a high carrier concentration region that has a higher impurity concentration than the low carrier concentration region; the first electrode is preferably a Schottky electrode formed on the low carrier concentration region; the second electrode is preferably an ohmic electrode formed on the high carrier concentration region; and the semiconductor device preferably operates as a diode, and the semi-insulating film preferably covers a portion of the surface of the device formation region, which is located between the Schottky electrode and the ohmic electrode. By forming the semiconductor device having this structure, a high voltage Schottky barrier diode is obtained reliably.

In this case, the resistivity of the semi-insulating film is preferably equal to or higher than $1\times10^6$ Ωcm but not more than $1\times10^{10}$ Ωcm.

In the inventive semiconductor devices, a highly uniform resistivity is achieved on the semiconductor layer surface and decrease in breakdown voltage caused by concentration of electric field does not occur.

DESCRIPTION OF THE PREFERRED EMBODIMENTS

First Embodiment

Figure 1:
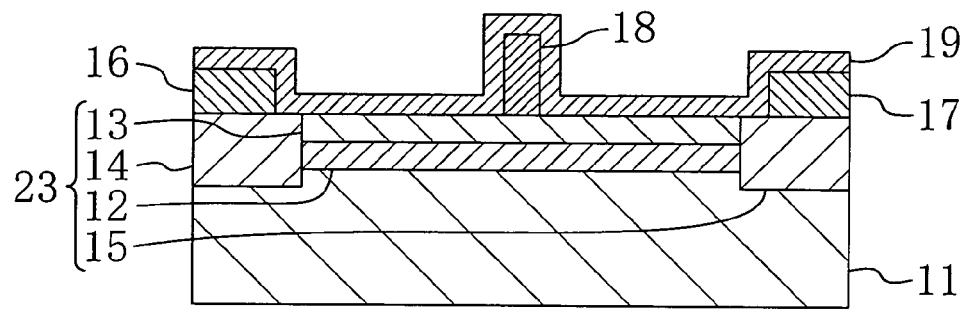
FIG. 1 is a cross-sectional view illustrating the structure of a semiconductor device according to a first embodiment of the present invention.

A semiconductor device according to a first embodiment of the present invention will be described with reference to the accompanying drawings. FIG. 1 illustrates a cross-sectional structure of the semiconductor device of this embodiment. As shown in FIG. 1, the semiconductor device of this embodiment is a metal semiconductor field effect transistor (MESFET). In the semiconductor device, a device formation region 23 is formed consisting of: an n-type GaAs channel layer 12 formed on a semi-insulating GaAs substrate 11; an undoped AlGaAs layer 13 formed on the channel layer 12; and source and drain regions 14 and 15, which are high carrier concentration regions formed with both sides of the channel layer 12 and AlGaAs layer 13 interposed therebetween. A gate electrode 18 is formed on the AlGaAs layer 13, while source and drain electrodes 16 and 17 are formed with the gate electrode 18 sandwiched therebetween. The source and drain electrodes 16 and 17 are formed on the source and drain regions 14 and 15, respectively.

The surface of the semiconductor device of this embodiment is covered with a semi-insulating BCN film 19 containing boron, carbon, and nitrogen. The BCN film 19, deposited by a plasma chemical vapor deposition (plasma CVD) process to have a thickness of from 100 nm to 500 nm, is formed to be a semi-insulating film having a volume resistivity of about $1 \times 10^8$ Ωcm. Therefore, when a high bias voltage is applied between the gate electrode 18 and the drain electrode 17, a uniform electric field is applied to the surface of the AlGaAs layer 13 located under the BCN film 19.

The breakdown voltage of the AlGaAs layer 13 is about $4 \times 10^5$ V/cm. In a case where the distance between the gate electrode 18 and the drain electrode 17 is 3 μm, the breakdown voltage in an ideal state will thus be about 120 V. However, application of a reverse bias of about 10 V usually causes occurrence of a breakdown for the following reasons. Crystal defects or the like existing on the surface of the AlGaAs layer 13 make the resistivity on the surface of the AlGaAs layer 13 become nonuniform, such that a concentration of electric field occurs, which results in local application of a high voltage that causes a breakdown.

In the MESFET of this embodiment, however, the semi-insulating BCN film 19 formed on the AlGaAs layer 13 allows the resistivity on the surface of the AlGaAs layer 13 to be substantially uniform. Therefore, even if crystal defects or the like are present on the surface of the AlGaAs layer 13, an electric field is uniformly applied to the surface of the AlGaAs layer 13, which enables the breakdown voltage to get close to an ideal state.

In a case where the electrode-to-electrode distance between the gate electrode 18 and the drain electrode 17 is 3 μm, if the BCN film 19 having a volume resistivity of $1 \times 10^8$ Ωcm and a thickness of 200 nm is provided, the resistance between the gate electrode 18 and the drain electrode 17 will be $1.5 \times 10^{10}$ Ωmm per unit gate width. In this case, if a reverse bias of 50 V is applied between the gate electrode 18 and the drain electrode 17, a leakage current of $3.3 \times 10^{-9}$ A/mm occurs. Thus, in a case of a typical FET having a gate width of 10 mm, the value of leakage current will be 33 nA, which is sufficiently small as compared to 1 μA, a leakage current value that causes a problem in the FET.

The BCN film 19 therefore does not significantly affect the leakage current characteristics of the high-output transistor.

As the volume resistivity of the BCN film 19 is decreased, the effect of uniformizing the electric field applied to the semiconductor surface increases, but the amount of leakage current also increases. Nevertheless, a typical FET has a leakage current of about 1 μA between the gate electrode and the drain electrode, so if a FET with a typical gate width and a typical electrode-to-electrode distance has a volume resistivity of $1 \times 10^6$ Ωcm or higher, such increase in leakage current is negligible. Also, if the volume resistivity is equal to, or less than, $1 \times 10^{10}$ Ωcm, which is substantially the same as the volume resistivity of a high-resistance semiconductor substrate, it is possible to achieve the effects of uniformizing the electric field and increasing the breakdown voltage.

Furthermore, since the value of capacitance between the gate electrode 18 and the drain electrode 17 is about 0.5 pF/mm, a time constant, which is obtained by multiplying the value of capacitance between the gate and drain electrodes 18 and 17 by the value of resistance of the BCN film 19 between the gate and drain electrodes 18 and 17, will be about $7.5 \times 10^{-3}$ seconds. This is sufficiently long as compared to $1 \times 10^{-9}$ seconds, which is the reciprocal of 1 GHz, a frequency often used in cellular phones or the like. In this frequency band, providing the BCN film 19 has little effect on the high frequency characteristics.

In terms of the time constant, if the resistivity of the BCN film is five orders of magnitude smaller, that is, about $1 \times 10^3$ Ωcm, the high frequency characteristics of the transistor are affected when the transistor is used at a frequency of 1 GHz. The usable frequency of the FET is about one third of the maximum oscillation frequency thereof, so if the high frequency characteristics are not affected at the maximum oscillation frequency, there will be no problem in the actual use. Therefore, if the time constant that is determined by the capacitance value between the gate and drain electrodes and the resistance value of the BCN film is longer than the reciprocal of the maximum oscillation frequency, the effect of the BCN film on the high-frequency characteristics of the FET is negligible.

In this embodiment, the BCN film 19 is provided so as to cover the portion between the gate and source electrodes 18 and 16 as well. However, since a high voltage is not applied between the gate and the source in normal operation, it is not necessary to provide the BCN film 19 between the gate and source electrodes 18 and 16. Also, in this embodiment, the BCN film 19 is provided so as to cover each electrode as well, but the BCN film 19 does not necessarily have to be provided on each electrode. If at least the surface of a region in the AlGaAs layer 13, in which a depletion layer extends, is covered with the BCN film 19, similar effects are attainable.

Although in this embodiment the exemplary MESFET using GaAs has been described, similar effects are obtainable in any semiconductor devices, in which a depletion layer extends when a reverse bias is applied to the gate electrode. Thus, InP, GaN or the like may be used. Furthermore, similar effects are achievable in a MISFET (metal insulator semiconductor FET), a junction FET and the like.

Modified Example of the First Embodiment

Figure 2:
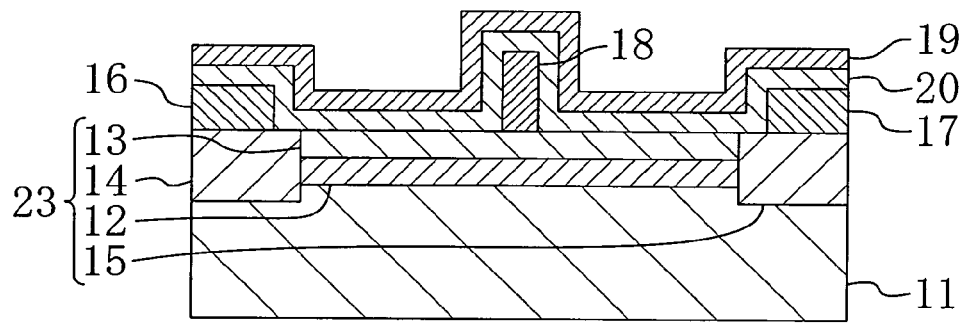
FIG. 2 is a cross-sectional view illustrating the structure of a semiconductor device according to a modified example of the first embodiment of the present invention.

Hereinafter, a modified example of the first embodiment will be described with reference to the accompanying figures. FIG. 2 illustrates a cross-sectional structure of a semiconductor device according to the modified example. In FIG. 2, the same members as those shown in FIG. 1 will be denoted by the same reference numerals and descriptions thereof will be omitted.

As shown in FIG. 2, the MESFET of this modified example differs from that of the first embodiment in that the BCN film 19 is formed on an insulating film 20 made of $SiO_2$. In cases where the BCN film 19 is formed on the insulating film 20 in this manner, it is also possible to uniformize the electric field applied to the AlGaAs layer 13 to increase the breakdown voltage. Moreover, since the BCN film 19 is not in direct contact with the AlGaAs layer 13, it is possible to decrease the value of leakage current.

In uniformizing the electric field applied to the AlGaAs layer 13, the smaller the thickness of the insulating film 20, the better, and it is preferable that the thickness be 50 nm or smaller. Also, in order to ensure that the insulating film 20 is grown easily and uniformly, it is preferable that the thickness be at least about 10 nm.

Although the insulating film 20 is made of $SiO_2$ in this modified example, the insulating film 20 may be a nitride film or the like.

Second Embodiment

Figure 3:
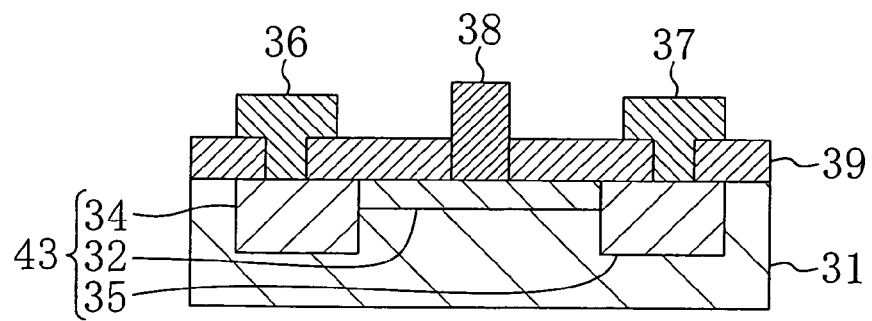
FIG. 3 is a cross-sectional view illustrating the structure of a semiconductor device according to a second embodiment of the present invention.

Hereinafter, a semiconductor device according to a second embodiment of the present invention will be described with reference to the accompanying figures. FIG. 3 illustrates a cross-sectional structure of the semiconductor device of this embodiment. As shown in FIG. 3, the semiconductor device of this embodiment is a MESFET that has a semiconductor region formed by implanting ions into a semiconductor substrate. A device formation region 43 is formed in a near-surface portion of a semi-insulating GaAs substrate 31 having a thickness of 500 μm. The device formation region 43 is composed of high concentration n-type source and drain regions 34 and 35 formed spaced apart from each other, and an n-type region 32 formed between the source and drain regions 34 and 35. On the GaAs substrate 31 that includes the device formation region 43, a 200-nm-thick BCN film 39 is formed.

Source and drain electrodes 36 and 37 are formed on portions of the surface of the BCN film 39 which are located on the source and drain regions 34 and 35, respectively. The source and drain electrodes 36 and 37, passing through the BCN film 39 to be in contact with the respective source and drain regions 34 and 35, are each composed of, in sequence from their underside, an alloy (AuGeNi) film of gold (Au), germanium (Ge) and nickel (Ni), and a gold film. Between the source and drain electrodes 36 and 37, a gate electrode 38 of aluminum (Al) that passes through the BCN film 39 to be in contact with the n-type region 32 is formed.

Figure 4A:
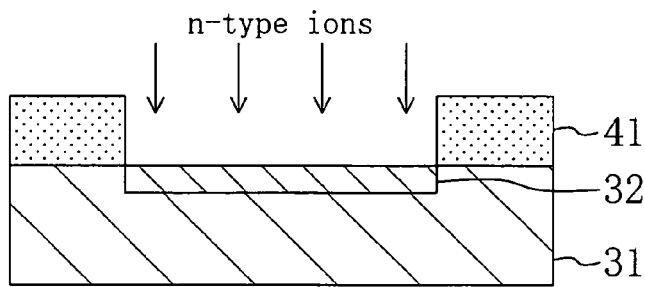
FIGS. 4A through 4E are cross-sectional views indicating process steps for fabricating the semiconductor device of the second embodiment of the present invention.

Hereinafter, it will be described how to fabricate the semiconductor device of this embodiment. FIGS. 4A through 4E are cross-sectional views indicating process steps for fabricating the semiconductor device of this embodiment. As shown in FIG. 4A, a 2-μm-thick first resist 41 having an opening is formed on the 500-μm-thick GaAs substrate 31 by a photolithography process. Then, with the first resist 41 used as a mask, silicon (Si) ions, which are n-type impurities, are implanted into the GaAs substrate 31 in a vacuum chamber at an acceleration voltage of 50 kV at a dose density of $2 \times 10^{12}$ $cm^{-2}$, thereby forming the n-type region 32 having a maximum depth is about 100 nm in a near-surface region of the GaAs substrate 31.

Figure 4B:
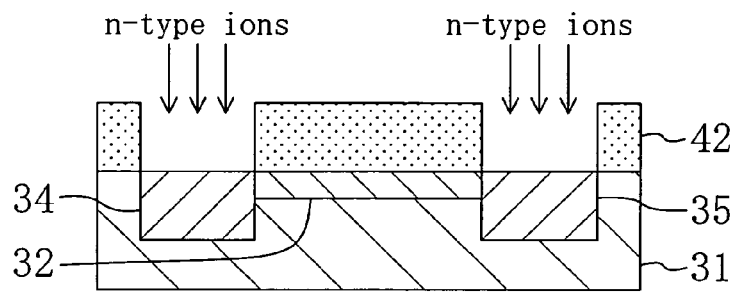

Next, as shown in FIG. 4B, the first resist 41 is removed, after which regions including both sides of the n-type region 32 are exposed, and a second resist 42, which covers the central portion of the n-type region 32, is formed by a photolithography process. Subsequently, with the second resist 42 used as a mask, Si ions are implanted at an acceleration voltage of 120 kV at a dose density of $5 \times 10^{13}$ $cm^{-2}$, thereby forming the high concentration n-type source and drain regions 34 and 35 each having a maximum depth of about 300 nm.

Figure 4C:
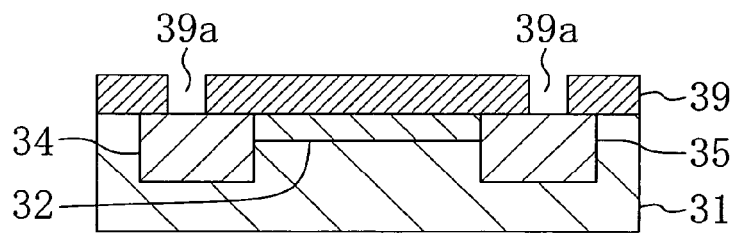

Then, as shown in FIG. 4C, after the second resist is removed, the GaAs substrate 31 is subjected to a heat treatment at 800° C. in an atmosphere of arsine gas for activation of the Si ions. Subsequently, the BCN film 39 having a resistivity of $1 \times 10^8$ Ωcm is deposited on the GaAs substrate 31 to a thickness of 200 nm by a CVD process and then selectively etched by a photolithography process and by a dry-etching process in which tetrafluoromethane ($CF_4$) gas and $O_2$ gas are used, thereby forming two openings 39a for exposing the sourac and drain regions 34 and 35.

The formation of the BCN film 39 may be performed under the following conditions: a boron trichloride ($BCl_3$) gas as a boron source, a methane ($CH_4$) gas as a carbon source, and a nitrogen ($N_2$) gas as a nitrogen source, e.g., are supplied into a chamber at flow rates of 1 ml/min (at 0° C. and 1 atm), 1 ml/min (at 0° C. and 1 atm), and 3 ml/min (at 0° C. and 1 atm), respectively; the substrate temperature is 300° C.; and the formation pressure is 133 Pa.

Figure 4D:
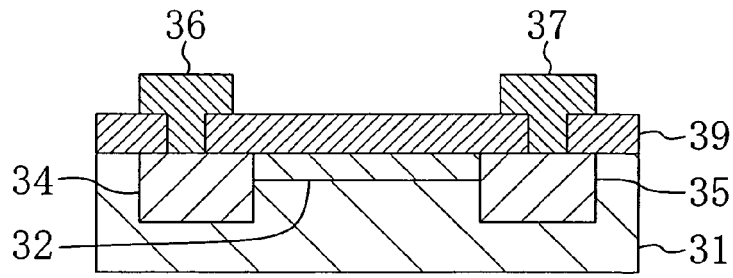
Figure 4E:
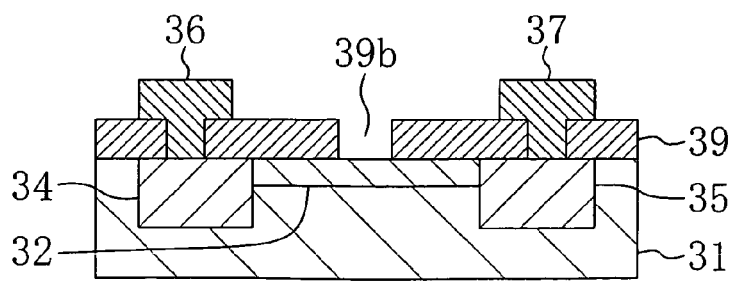

Next, as shown in FIG. 4D, an AuGeNi film having a thickness of about 100 nm and an Au film having a thickness of about 300 nm are deposited in sequence on the BCN film 39 by an electron-beam evaporation method so as to fill the two openings. Subsequently, unnecessary portions are removed by a lift-off method, thereby forming the source and drain electrodes 36 and 37 each having an electrode width of 10 μm. Thereafter, a heat treatment is performed at 400° C. for 10 minutes, whereby the source and drain electrodes 36 and 37 are in ohmic contact with the source and drain regions 34 and 35, respectively.

Next, a resist pattern (not shown) having an opening in a gate-electrode formation region is formed, after which the BCN film 39 is dry-etched to form an opening 39b for exposing the n-type region 32. Then, an Al film is deposited to a thickness of 700 nm by an electron-beam evaporation method so as to fill the opening, and then a lift-off process is performed to form the gate electrode 38 having a gate length of 200 nm. The distance between the middle point of the source electrode 36 and the middle point of the gate electrode 38 is 7 μm, while the distance between the middle point of the drain electrode 37 and the middle point of the gate electrode 38 is 10 μm.

The dc operating characteristics of the MESFET obtained in the above manner were actually examined and it was found that the breakdown voltage was 30 V. On the other hand, in a semiconductor device in which no BCN film 39 was formed, the breakdown voltage was 12 V. From this, it is obvious that the formation of the BCN film 39 enables an electric field to be uniformly applied to the device formation region 43, which results in the increase in the breakdown voltage of the semiconductor device.

In the semiconductor device of this embodiment, a thin insulating film may be formed between the BCN film and the semiconductor layers, as in the modified example of the first embodiment. The presence of the insulating film permits the value of leakage current to be reduced.

Third Embodiment

Figure 5:
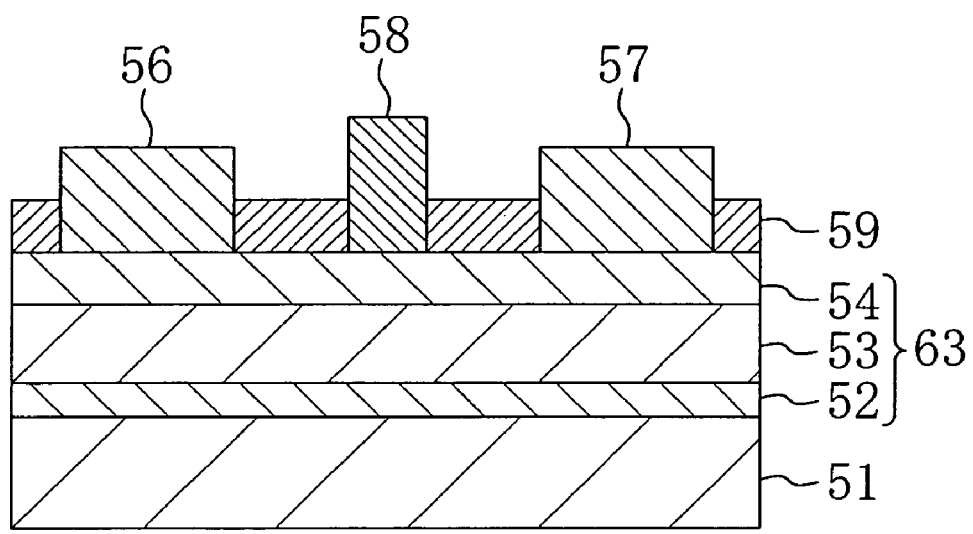
FIG. 5 is a cross-sectional view illustrating the structure of a semiconductor device according to a third embodiment of the present invention.

Hereinafter, a semiconductor device according to a third embodiment of the present invention will be described with reference to the accompanying figures. FIG. 5 illustrates a cross-sectional structure of the semiconductor device of this embodiment. As shown in FIG. 5, the semiconductor device of this embodiment is a high electron mobility transistor (HEMT), in which a device formation region 63 made of semiconductor layers is formed on a sapphire substrate 51 having a thickness of 500 µm. The device formation region 63 is composed of a buffer layer 52, a channel layer 53, and an electron supply layer 54. The buffer layer 52 is made of aluminum nitride (AlN) and having a thickness of 500 nm. The channel layer 53 formed on the buffer layer 52 is made of a 2-µm-thick undoped GaN film. The electron supply layer 54 formed on the channel layer 53 is made of a 25-nm-thick undoped $Al_{0.25}Ga_{0.75}N$ film. A high-concentration two-dimensional electron gas (2DEG) is formed in the channel layer 53 near the interface with the electron supply layer 54 by piezoelectric polarization and spontaneous polarization.

On the electron supply layer 54, source and drain electrodes 56 and 57, in which a 10-nm-thick titanium (Ti) film and a 300-nm-thick aluminum (Al) film are stacked, are formed spaced apart from each other. A gate electrode 58, in which a 50-nm-thick Ni film and a 400-nm-thick Au film are stacked, is formed between the source and drain electrodes 56 and 57. Also, a semi-insulating BCN film 59 having a thickness of 200 nm and a resistivity of $1 \times 10^8$ Ωcm is formed on the surface of the electron supply layer 54 except for the regions covered with the source and drain electrodes 56 and 57 and the gate electrode 58.

Figure 6A:
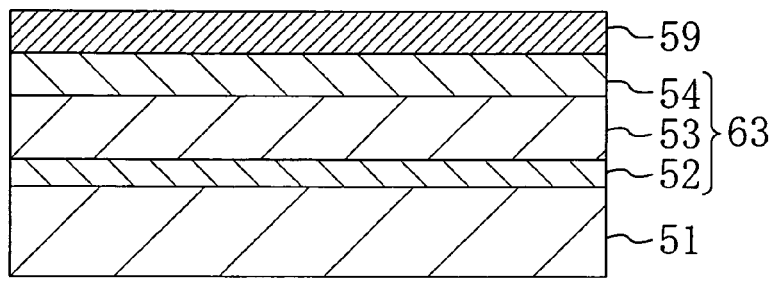
FIGS. 6A through 6D are cross-sectional views indicating process steps for fabricating the semiconductor device of the third embodiment of the present invention.

Hereinafter, it will be described how to fabricate the semiconductor device of this embodiment with reference to the accompanying figures. FIGS. 6A through 6D are cross-sectional views indicating process steps for fabricating the semiconductor device of this embodiment. As shown in FIG. 6A, first, the cleaned substrate 51 made of sapphire is subjected to a thermal cleaning process in a crystal growth apparatus, after which crystals of the AlN buffer layer 52, channel layer 53, and electron supply layer 54 are sequentially grown over the substrate 51 by metal-organic vapor-phase epitaxy.

Subsequently, the BCN film 59 is formed on the electron supply layer 54 by a chemical vapor deposition process. The BCN film 59 may be formed under the following conditions: a boron trichloride ($BCl_3$) gas as a boron source, a methane ($CH_4$) gas as a carbon source, and a nitrogen ($N_2$) gas as a nitrogen source, e.g., are supplied into a chamber at flow rates of 1 ml/min (at 0° C. and 1 atm), 1 ml/min (at 0° C. and 1 atm), and 3 ml/min (at 0° C. and 1 atm), respectively; the substrate temperature is 300°C.; and the formation pressure is 133 Pa.

Figure 6B:
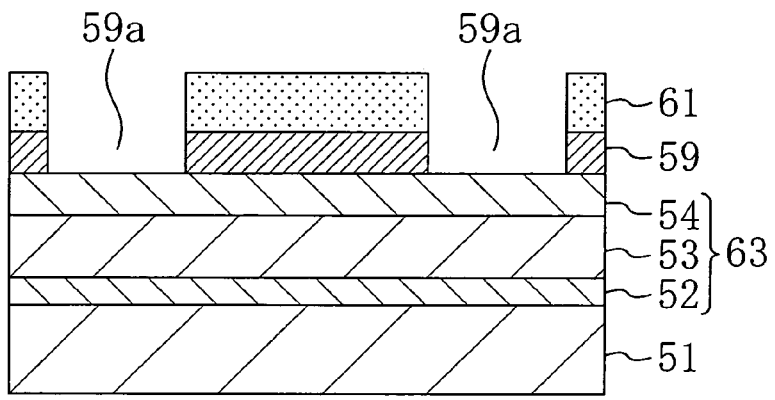

Next, as shown in FIG. 6B, a first resist 61 having two openings is formed on the BCN film 59 by a photolithography process. Thereafter, with the resist 61 used as a mask, the BCN film 59 is selectively dry-etched using $Cf_4$ and $O_2$, thereby forming two openings 59a.

Figure 6C:
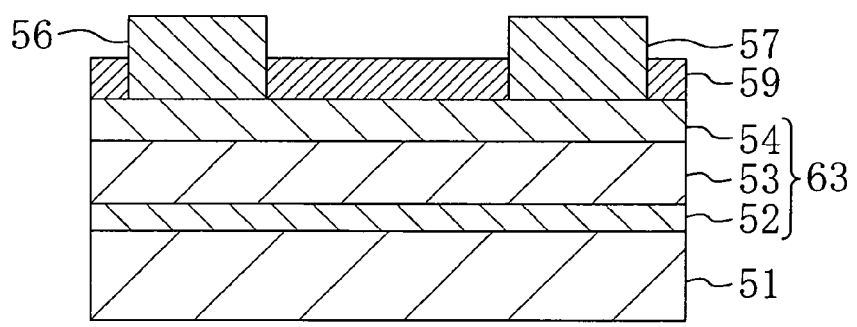

Then, as shown in FIG. 6C, a metal film (not shown) made of Ti and Al is formed on the first resist 61 by vacuum evaporation so as to fill the openings 59a. Thereafter, an ultrasonic irradiation is performed with the substrate 51 being in acetone, whereby the first resist 61 is removed, while the metal layer formed on the first resist 61 is lifted off, thereby forming the source and drain electrodes 56 and 57. Subsequently, a heat treatment is performed at 600° C. for 15 minutes, whereby the source and drain electrodes are in ohmic contact with the electron supply layer 54.

Figure 6D:
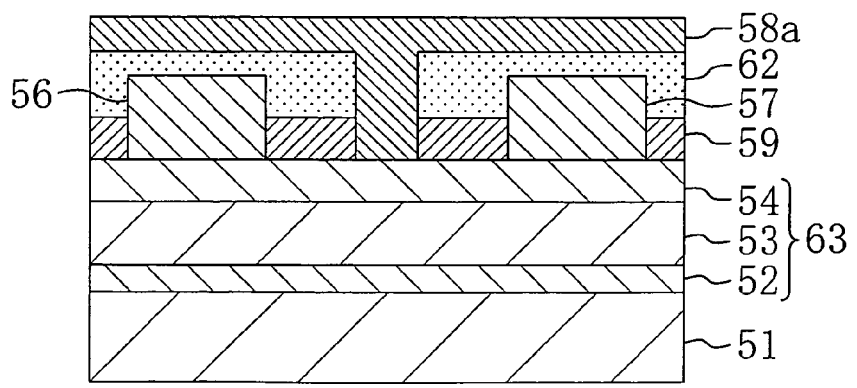

Next, as shown in FIG. 6D, a second resist 62, which covers the source and drain electrodes 56 and 57, is formed on the BCN film 59 and a resist pattern is then formed by a photolithography process. Then, with the second resist 62 used as a mask, the BCN film 59 is dry-etched to form an opening for exposing the electron supply layer 54 between the source and drain electrodes 56 and 57. Furthermore, a metal layer 58a made of Ni and Au is formed on the second resist 62 by vacuum evaporation so as to fill the opening. Thereafter, an ultrasonic irradiation is performed in acetone, whereby the second resist 62 is removed, while the metal layer 58a is lifted off, thereby forming the gate electrode 58.

The source and drain electrodes 56 and 57 have an electrode width of 10 µm, and the gate electrode 58 has a gate length of 0.5 µm. The distance between the middle point of the source electrode 56 and the middle point of the gate electrode 58 is 7 µm, while the distance between the middle point of the drain electrode 57 and the middle point of the gate electrode 58 is 10 µm.

The dc operating characteristics of the HEMT obtained in the above manner were actually examined and it was found that the breakdown voltage was 200 V. On the other hand, in a semiconductor device in which no BCN film 59 was formed, the breakdown voltage was 60 V. From this, it is obvious that the formation of the BCN film 59 allows an electric field to be uniformly applied to the electron supply layer 54, which results in the increase in the breakdown voltage of the semiconductor device.

In the semiconductor device of this embodiment, a thin insulating film may be formed between the BCN film and the semiconductor layers, as in the modified example of the first embodiment. The presence of the insulating film permits the value of leakage current to be reduced.

In this embodiment, the exemplary HEMT formed on the sapphire substrate has been described. Nevertheless, similar effects are also obtained in a HEMT formed on a SiC substrate, GaN substrate or the like.

Fourth Embodiment

Figure 7:
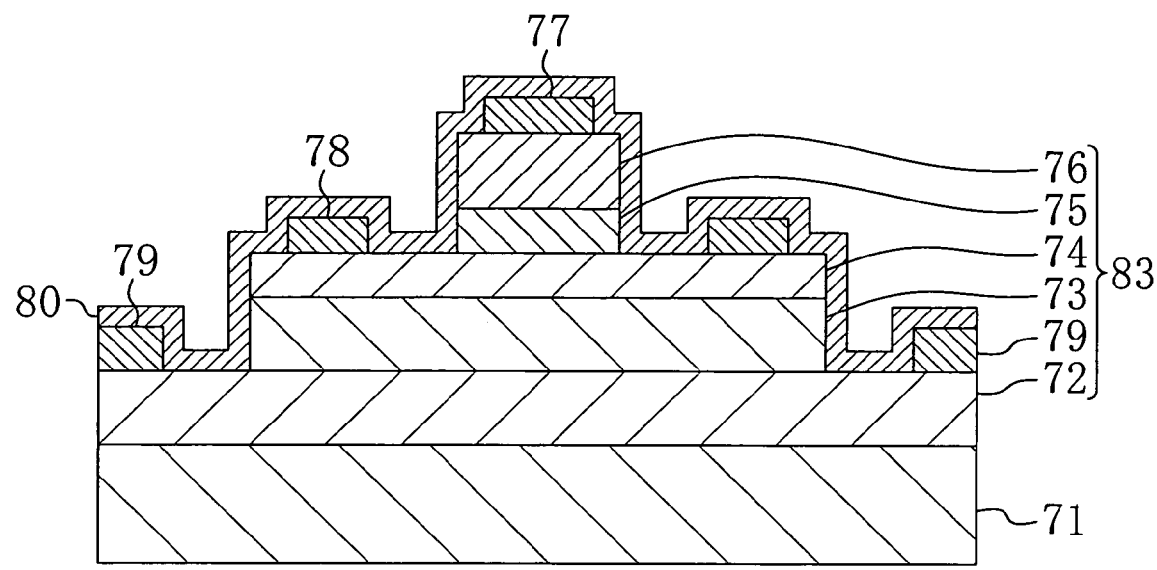
FIG. 7 is a cross-sectional view illustrating the structure of a semiconductor device according to a fourth embodiment of the present invention.

Hereinafter, a semiconductor device according to a fourth embodiment of the present invention will be described with reference to the accompanying figures. FIG. 7 illustrates a cross-sectional structure of the semiconductor device of this embodiment. As shown in FIG. 7, the semiconductor device of this embodiment is a hetero-bipolar transistor (HBT), in which a device formation region 83 made of semiconductor layers is formed on a semi-insulating GaAs substrate 71. The device formation region 83 is composed of a collector contact layer 72 made of $n^+$—GaAs, a collector layer 73 made of $n^-$—GaAs, a base layer 74 made of $p^+$—GaAs, an emitter layer 75 made of $n^-$—InGaP, and an emitter collector layer 76 made of $n^+$—GaAs and $n^+$—InGaAs. The collector layer 73 and the base layer 74 are sequentially formed on the upper surface of the collector contact layer 72 except for the both end portions of the surface. The emitter layer 75 and the emitter collector layer 76 are sequentially formed on the upper surface of the base layer 74 except for the both end portions of the surface.

An emitter electrode 77 is formed on a portion of the upper surface of the emitter collector layer 76, and a base electrode 78 is formed on a portion of the exposed region of the base layer 74. And a collector electrode 79 is formed on a portion of the exposed region of the collector contact layer 72.

On the HBT device, a BCN film 80 having a thickness of 200 nm and a resistivity of $1 \times 10^8$ Ωcm is formed.

In the high-output HBT, when a reverse bias is applied between the base electrode 78 and the collector electrode 79, a depletion layer extends in a region in the collector layer 73 near the sidewall thereof. In this situation, if crystal defects or the like exist on the surface of the sidewall of the collector layer 73, a concentration of electric field occurs to decrease the breakdown voltage. However, in the HBT of this embodiment, the BCN film 80 covers the exposed region of the collector layer 73, so that the electric field on the surface of the sidewall of the collector layer 73 is uniform. Therefore, a breakdown caused by a concentration of electric field does not occur until the applied voltage comes close to the breakdown voltage determined by the impurity concentration and thickness of the collector layer 73.

Also, in a case in which the thickness of the base layer 74 is 0.1 µm, the thickness of the collector layer 73 is 0.5 µm, the emitter electrode 77 has a rectangular shape, and the BCN film 80 having a thickness of 200 nm and a resistivity of $1 \times 10^8$ Ωcm is formed, the value of resistance between the base electrode 78 and the collector electrode 79 will be $1.5 \times 10^9$ Ωmm per unit emitter length. In this case, if a voltage of 50 V is applied between the base electrode 78 and the collector electrode 79, a leakage current of $3.3 \times 10^{-8}$ A/mm occurs. Thus, in a case of a typical HBT having an emitter length of 2 mm, the value of leakage current will be 66 nA, which is sufficiently small as compared to 1 µA, a leakage current value that will cause a problem in the high-output transistor. The BCN film 80 thus does not significantly affect the leakage current characteristics of the high-output transistor.

As the volume resistivity of the BCN film 80 decreases, the effect of uniformizing the electric field on the semiconductor surface increases, but the amount of leakage current also increases. Nevertheless, a typical HBT has a leakage current of about 1 µA between the base electrode and the collector electrode, so if a typical HBT has a volume resistivity of $1 \times 10^6$ Ωcm or higher, such increase in leakage current is negligible. Also, if the volume resistivity is equal to, or less than, $1 \times 10^{10}$ Ωcm, which is substantially the same as the volume resistivity of a high-resistance semiconductor substrate, it is possible to achieve the effects of uniformizing the electric field and increasing the breakdown voltage.

Furthermore, since the value of capacitance between the base electrode 78 and the collector electrode 79 is about 2 pF/mm, a time constant, which is obtained by multiplying the value of capacitance between the base and collector electrodes 78 and 79 by the value of resistance of the BCN film 80, will be about $3.0 \times 10^{-3}$ seconds. This is sufficiently long as compared to $1 \times 10^{-9}$ seconds, which is the reciprocal of 1 GHz, a frequency often used in cellular phones or the like. In this frequency band, therefore, providing the BCN film 80 has little effect on the high frequency characteristics.

In terms of the time constant, if the resistivity of the BCN film 80 is five orders of magnitude smaller, that is, about $1 \times 10^3$ Ωcm, the high frequency characteristics of the transistor are affected when the transistor is used at a frequency of 1 GHz. The usable frequency of the HBT is about one third of the maximum oscillation frequency thereof, so if the high frequency characteristics are not affected at the maximum oscillation frequency, there will be no problem in the actual use. Therefore, if the time constant that is determined by the value of capacitance between the base and collector electrodes 78 and 79 and the value of resistance of the BCN film 80 is longer than the reciprocal of the maximum oscillation frequency, the effect of the BCN film 80 on the high-frequency characteristics of the HBT is negligible.

In this embodiment, the BCN film 80 is provided so as to cover the portion between the base and emitter electrodes 78 and 77 as well. However, since a high voltage is not applied between the base and the emitter in normal operation, it is not necessary to provide the BCN film 80 between the base and emitter electrodes 78 and 77. If at least the exposed portion of the collector layer 73 is covered with the BCN film 80, similar effects are attainable.

In the semiconductor device of this embodiment, a thin insulating film may be formed between the BCN film and the semiconductor layers, as in the modified example of the first embodiment. The presence of the insulating film permits the value of leakage current to be reduced.

Although in this embodiment the exemplary GaAs-based HBT has been described, similar effects are also obtainable in an InP—, GaN—, or SiC-based HBT.

Fifth Embodiment

Figure 8:
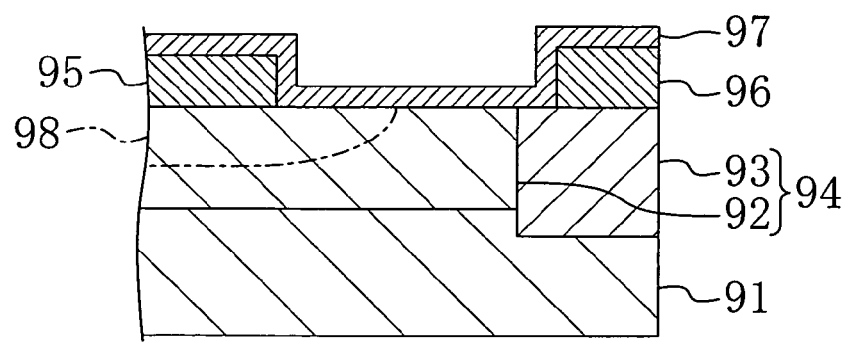
FIG. 8 is a cross-sectional view illustrating the structure of a semiconductor device according to a fifth embodiment of the present invention.
Figure 9:
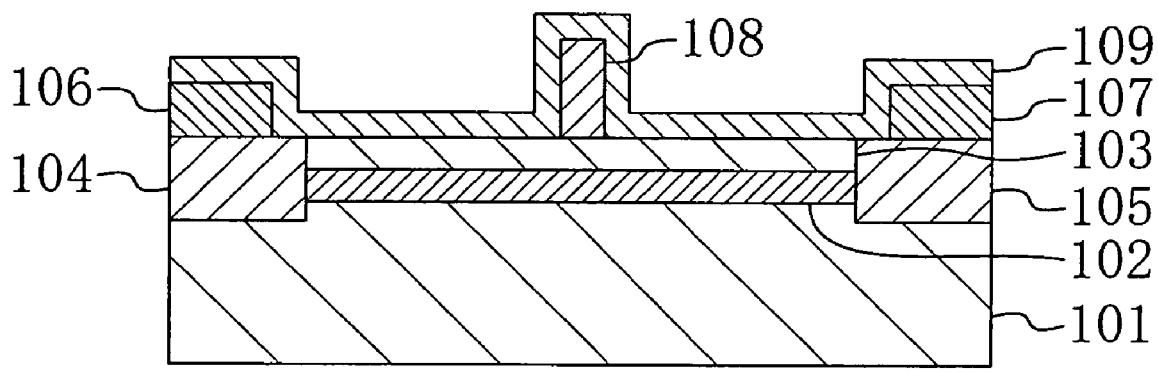
FIG. 9 is a cross-sectional view illustrating the structure of a conventional semiconductor device.

Hereinafter, a semiconductor device according to a fifth embodiment of the present invention will be described with reference to the accompanying figures. FIG. 8 illustrates a cross-sectional structure of the semiconductor device of this embodiment. As shown in FIG. 8, the semiconductor device of this embodiment is a Schottky diode, in which a device formation region 94, composed of a low carrier concentration region 92 and a high carrier concentration region 93 formed adjacent to the low carrier concentration region 92, is formed on a semi-insulating GaAs substrate 91. A Schottky electrode 95 is formed on the low carrier concentration region 92, while an ohmic electrode 96 is formed on the high carrier concentration region 93. A semi-insulating BCN film 97 having a resistivity of $1 \times 10^8$ Ωcm is formed on the low and high carrier concentration regions 92 and 93 as well as on the Schottky and ohmic electrodes 95 and 96.

When a reverse bias is applied to the Schottky electrode 95, a Schottky depletion layer 98 extending from the Schottky electrode 95 to the ohmic electrode 96 is formed in a near-surface region in the low carrier concentration region 92. In this situation, if crystal defects or the like exist on the region in the surface of the low carrier concentration region 92 between the Schottky electrode 95 and the ohmic electrode 96, a concentration of electric field occurs to decrease the breakdown voltage of the Schottky diode. However, in the Schottky diode of this embodiment, the semi-insulating BCN film 97 is formed on the surface of the semiconductor layer that includes the low carrier concentration region 92, so that the electric field on the surface of the semiconductor layer between the Schottky electrode 95 and the ohmic electrode 96 becomes uniform. Therefore, decrease in the breakdown voltage of the Schottky diode caused by a concentration of electric field does not occur.

Although the resistivity of the BCN film 97 is $1 \times 10^8$ Ωcm in this embodiment, if the resistivity is equal to or less than $1 \times 10^{10}$ Ωcm, the effect of uniformizing the electric field between the Schottky electrode and the ohmic electrode is achieved, and if the resistivity is equal to or higher than $1 \times 10^6$ Ωcm, increase in leakage current is negligible.

In the semiconductor device of this embodiment, a thin insulating film may be formed between the BCN film and the semiconductor layers, as in the modified example of the first embodiment. The presence of the insulating film permits the value of leakage current to be reduced.

In the foregoing embodiments and modified example, a BCN film is used as a semi-insulating film. In place of boron, however, aluminum or gallium, which is also a Group III element, may be used. Alternatively, a film containing all or any two of boron, aluminum and gallium may be used.

As described above, the inventive semiconductor devices, which have a highly uniform resistivity on their semiconductor layer surface and whose breakdown voltage does not decrease, are applicable to field effect transistors, bipolar transistor, diodes, and other semiconductor devices that are required to have a high breakdown voltage.

What is claimed is:

1. A semiconductor device comprising:
   a device formation region formed on a substrate and including at least one semiconductor region;
   a first electrode and a second electrode formed spaced apart from each other on the device formation region;
   a semi-insulating film covering the surface of a portion of the device formation region, which portion is located between the first and second electrodes and in which portion a depletion layer extends when a reverse bias is applied between the first and second electrodes; and
   an insulating film provided between the semi-insulating film and the surface of the device formation region.

2. The device of claim 1, wherein the device formation region includes an epitaxial layer formed on the substrate.

3. The device of claim 1, wherein the device formation region includes a doped layer formed by implanting impurities into the substrate.

4. The device of claim 1, wherein the device formation region includes a channel layer in which electrons move; the first electrode is a gate electrode;
   the second electrode is a drain electrode; the semiconductor device further includes a source electrode formed in a position that opposes the drain electrode with the gate electrode interposed;
   and the semiconductor device operates as a field effect transistor, and the semi-insulating film covers a portion of the surface of the device formation region, which is located between the gate and drain electrodes.

5. The device of claim 4, wherein the semi-insulating film is made of a compound containing nitrogen, carbon, and at least one element selected from the group consisting of boron, aluminum and gallium.

6. The device of claim 1, wherein the resistivity of the semi-insulating film is equal to or higher than $1\times10^6$ $\Omega$cm but not more than $1\times10^{10}$ $\Omega$cm.

7. The device of claim 1, wherein the insulating film is made of silicon oxide.

8. The device of clam 1, wherein the insulating film is a nitride film.

9. The device of claim 1, wherein the device formation region includes a collector region,
   a base region, and an emitter region, which are formed in this order from the lowermost film; the first electrode is a collector electrode formed in a predetermined portion on the corrector region;
   the second electrode is a base electrode formed in a predetermined portion on the base region;
   the semiconductor device further includes an emitter electrode formed in a predetermined portion on the emitter region; and the semiconductor device operates as a hetero-bipolar transistor, and the semi-insulating film covers a portion of the surface of the device formation region, which is located between the collector electrode and the base electrode.

10. The device of claim 9, wherein the semi-insulating film is made of a compound containing nitrogen, carbon, and at least one element selected from the group consisting of boron, aluminum and gallium.

11. The device of claim 9, wherein the semi-insulating film has a resistivity that is lower than that of silicon nitride and that makes a time constant,
    which is the product of a value of capacitance between the collector and emitter electrodes and a value of resistance occurring between the collector and emitter electrodes due to the semi-insulating film, be longer than a time,
    which is the reciprocal of a maximum oscillation frequency of the hetero-bipolar transistor, the resistance value being part of a total value of resistances existing between the collector and emitter electrodes.

12. The device of claim 9, wherein the semi-insulating film has a resistivity that is lower than that of silicon nitride and that makes a time constant,
    which is the product of a value of capacitance between the collector and base electrodes and a value of resistance occurring between the collector and base electrodes due to the semi-insulating film, be longer than a time, which is the reciprocal of a maximum oscillation frequency of the hetero-bipolar transistor,
    the resistance value being part of a total value of resistances existing between the collector and base electrodes.

13. The device of claim 9, wherein the resistivity of the semi-insulating film is equal to or higher $1\times10^6$ $\Omega$cm but not more than $1\times10^{10}$ $\Omega$cm.

14. The device of claim 1, wherein the device formation region includes a low carrier concentration region and a high carrier concentration region that has a higher impurity concentration than the low carrier concentration region;
    the first electrode is a Schottky electrode formed on the low carrier concentration region; the second electrode is an ohmic electrode formed on the high carrier concentration region; and the semiconductor device operates as a diode,
    and the semi-insulating film covers a portion of the surface of the device formation region, which is located between the Schottky electrode and the ohmic electrode.

15. The device of claim 14, wherein the semi-insulating film is made of a compound containing nitrogen, carbon, and at least one element selected from the group consisting of boron, aluminum and gallium.

16. The device of claim 14, wherein the resistivity of the semi-insulating film is equal to or higher than $1\times10^6$ $\Omega$cm but not more than $1\times10^{10}$$\Omega$cm.

* * * * *